(12) United States Patent
Sanders et al.

(10) Patent No.: US 12,557,255 B1
(45) Date of Patent: Feb. 17, 2026

(54) SHIELDED ENCLOSURE

(71) Applicant: CenCore Group, LLC, Springville, UT (US)

(72) Inventors: Jesse Sanders, Springville, UT (US); Adam Fife, Springville, UT (US)

(73) Assignee: CenCore Group, LLC, Springville, UT (US)

( * ) Notice: Subject to any disclaimer, the term of this patent is extended or adjusted under 35 U.S.C. 154(b) by 0 days.

(21) Appl. No.: 19/209,770

(22) Filed: May 15, 2025

(51) Int. Cl.
*H05K 9/00* (2006.01)

(52) U.S. Cl.
CPC .................. *H05K 9/0003* (2013.01)

(58) Field of Classification Search
CPC .................................................. H05K 9/0003
See application file for complete search history.

(56) References Cited

U.S. PATENT DOCUMENTS

| | | | |
|---|---|---|---|
| 4,959,504 A * | 9/1990 | Yarger | H05K 9/0001 174/386 |
| 5,761,053 A | 6/1998 | King et al. | |
| 10,117,365 B2 | 10/2018 | Elizondo, II | |
| 2001/0046119 A1 * | 11/2001 | Hamano | H05K 9/0022 361/679.54 |
| 2004/0026162 A1 | 2/2004 | Christen | |
| 2010/0094117 A1 * | 4/2010 | Kruemmel | H05K 9/0001 324/228 |
| 2011/0088940 A1 * | 4/2011 | Nordling | H05K 9/0001 174/382 |
| 2020/0037475 A1 * | 1/2020 | Rauscher | H01F 1/14716 |
| 2020/0229328 A1 * | 7/2020 | Deighton | E04C 2/46 |
| 2023/0255008 A1 * | 8/2023 | Deighton | H05K 9/0084 |

FOREIGN PATENT DOCUMENTS

EP 0806892 B1 11/1997

\* cited by examiner

*Primary Examiner* — Hung V Ngo

(57) ABSTRACT

A shielded enclosure system includes an outer metallic box and an inner metallic box enclosed within the outer metallic box. The outer metallic box has a non-metallic coating covering an interior surface of the outer metallic box. The inner metallic box encloses an interior workspace. The shielded enclosure system further includes a metallic mesh between the coating and the inner metallic box and an air gap between the outer metallic box and the inner metallic box.

22 Claims, 9 Drawing Sheets

SHIELDED ENCLOSURE

BACKGROUND

Current technologies have yet to reach the full capabilities necessary for a secure compartmentalized area for critical communications in environments where sensitive or potentially classified information is discussed. There are many situations where secure communications are required or desired. In military, government, corporate, and intelligence sectors, unauthorized access to confidential conversations and other communications can lead to severe consequences, including national security threats, data breaches, and corporate espionage. A secure area ensures that discussions and data transmissions remain protected from surveillance, interception, or leakage.

One of the primary reasons for having a secure compartmentalized space is to prevent electronic eavesdropping. In today's digital age, adversaries use sophisticated surveillance techniques and new technologies are needed to ensure communications and trade secrets are kept secure from more sophisticated surveillance technologies.

SUMMARY

A shielded enclosure system is disclosed. Embodiments of the invention include a shielded enclosure apparatus that separates an interior workspace (alternatively called a work area, production space, or protected area) from a surrounding environment. Some embodiments of the invention include generally two boxes, an outer box and an inner box. The outer box (alternatively called an exterior box, exterior metallic box, shipping container, ISO container, shield line exterior box) surrounds and encloses the inner box (alternatively called an interior box, interior metallic box, shield line interior box). The outer box includes at least one door or area of ingress/egress to access the inner box. The inner box surrounds and encloses the interior workspace. The inner box includes at least one door or area of ingress/egress to access the interior workspace.

In some embodiments, the shielded enclosure system includes an outer metallic box and an inner metallic box enclosed within the outer metallic box. In some embodiments, the outer metallic box has a non-metallic coating covering an interior surface of the outer metallic box. In some embodiments, the inner metallic box enclosed within the outer metallic box. In some embodiments, the shielded enclosure system includes a metallic mesh between the coating and the inner metallic box. In some embodiments, there is an air gap between the outer metallic box and the inner metallic box.

In some embodiments, the inner metallic box and the outer metallic box have separate grounding locations.

In some embodiments, the inner metallic box comprises an inner panel that forms the interior surface of the inner metallic box and an outer panel that forms the exterior surface of the inner metallic box with a gap between the inner panel and the outer panel.

In some embodiments, the inner metallic box further comprises acoustic insulation within the gap between the inner panel and the outer panel.

In some embodiments, the acoustic insulation is mineral wool.

In some embodiments, the metallic mesh is a mesh copper abutting the coating on the interior surface of the outer metallic box.

In some embodiments, the coating is a non-metallic board that surrounds the air gap.

In some embodiments, the coating is a non-metallic paint.

In some embodiments, the outer metallic box is an ISO container.

In some embodiments, the outer metallic box is 14-gauge steel.

A shielded enclosure system is disclosed. In some embodiments, the shielded enclosure system includes a double shield line enclosure including a first shield line interior box; and a second shield line exterior box. In some embodiments, the first shield line interior box is separated from the second shield line exterior box by an air gap. In some embodiments, the shielded enclosure system includes a non-metallic coating on an interior surface of the second shield line exterior box.

In some embodiments, the first shield line interior box and the second shield line exterior box are grounded to separate ground sources.

In some embodiments, the first shield line interior box includes an inner panel, an outer panel, and a gap between the inner metallic panel and the outer metallic panel.

In some embodiments, the first shield line interior box further comprises acoustic insulation within the gap between the inner panel and the outer panel.

In some embodiments, the first shield line interior box further comprises an area of ingress/egress that comprises of an outer door separated from an inner door.

In some embodiments, a floor of the first shield line interior box and a floor of the second shield line exterior box are separated by a non-metallic base floor.

In some embodiments, the non-metallic base floor is a wood panel that separates the floor of the first shield line interior box and the floor of the second shield line exterior box.

In some embodiments, the shielded enclosure apparatus further comprises a metallic mesh between the non-metallic coating on the interior surface of the second shield line exterior box and the air gap.

In some embodiments, the metallic mesh is a mesh copper abutting the coating on the interior surface of the outer metallic box.

In some embodiments, the coating is a non-metallic paint.

A shielded enclosure system is disclosed. In some embodiments, the shielded enclosure system includes an outer metallic box; an inner metallic box enclosed within the outer metallic box, the inner metallic box enclosing an interior workspace; and a waveguide disposed between the outer metallic box and the inner metallic box, the waveguide having a plurality of cells. The shielded enclosure system, for example, is arranged to produce an electromagnetic transmission (e.g., RF signals) attenuation between 9 kHz and 40 gHz and/or to produce an STC rating greater than 40.

In some embodiments, the outer metallic box and the inner metallic box are arranged to form an air gap between the outer metallic box and the inner metallic box.

In some embodiments, the shielded enclosure system includes a metallic mesh disposed between the outer metallic box and the inner metallic box.

In some embodiments, the outer metallic box may have a non-metallic coating covering an interior surface of the outer metallic box.

In some embodiments, the outer metallic box, the inner metallic box, and the waveguide may be arranged to ensure the electromagnetic transmission attenuation and the STC rating are not compromised during transportation of the shielded enclosure system.

In some embodiments, the plurality of cells are arranged in a honeycomb pattern.

In some embodiments, the outer metallic box and the inner metallic box are grounded to separate ground sources.

A shielded enclosure system is disclosed. In some embodiments, the shielded enclosure system includes an outer metallic box grounded to a first grounding location; and an inner metallic box enclosed within the outer metallic box. In some embodiments, the inner metallic box enclosing an interior workspace. In some embodiments, the inner metallic box may be grounded to a second grounding location that is separate and distinct from the first grounding location.

The various embodiments described in the summary and this document are provided not to limit or define the disclosure or the scope of the claims.

BRIEF DESCRIPTION OF THE FIGURES

These and other features, aspects, and advantages of the present disclosure are better understood when the following Detailed Description is read with reference to the accompanying drawings.

DETAILED DESCRIPTION

Figure 1:
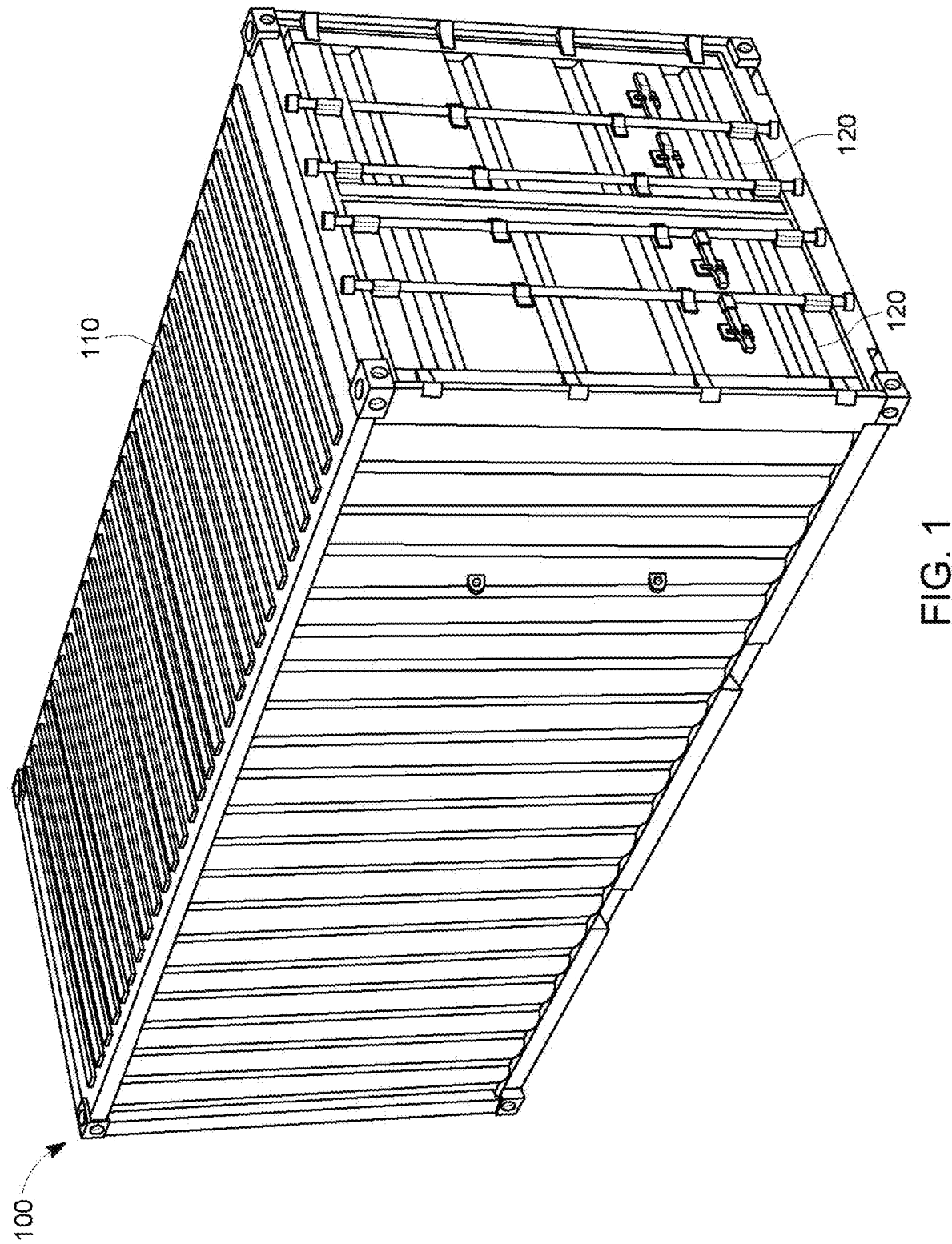
FIG. 1 is a perspective view of a shielded enclosure system according to some embodiments.

Embodiments of the invention include a shielded enclosure apparatus and systems that separate an interior workspace (alternatively called a work area, production space, or protected area) from a surrounding environment. Some embodiments of the invention include generally two boxes, an outer box and an inner box that work together to separate and enclose the interior workspace from the surrounding environment. The outer box (also called herein an exterior box, exterior metallic box, shipping container, ISO container, outer shield line, or shield line exterior box) surrounds and encloses the inner box (also called herein an interior box, interior metallic box, inner shield line, or shield line interior box). The outer box includes at least one door or area of ingress/egress to access the inner box. The inner box surrounds and encloses the interior workspace. The inner box includes at least one door or area of ingress/egress to access the interior workspace.

The interior workspace may be used for any work or communications that require isolation from a surrounding area that may be subject to sophisticated surveillance technologies. Any type of work may be conducted within the interior workspace. The interior workspace may include computer terminals or other types of electronic devices upon which a user can conduct work that is intended to be kept secret or isolated from the surrounding environment. Uses of the interior workspace may include but are not limited to government espionage, military, business, corporate, and/or other activities that are intended to remain free from external surveillance.

For businesses, protecting internal trade secrets is essential to maintaining a competitive edge and safeguarding proprietary information from competitors, cybercriminals, and corporate espionage. Whatever the information (a new product design, marketing strategy, financial data, or research and development (R&D) plans) keeping confidential information secure ensures that a company's intellectual property remains protected. Businesses face increasing threats from insider leaks, cyber intrusions, and corporate espionage. Competitors, foreign entities, or even disgruntled employees may attempt to steal sensitive information for financial or strategic gain. Embodiments described herein provide secure communication spaces.

For individuals or organizations that need to operate securely without the risk of interception, maintaining privacy and protecting communications is essential. Whether it's a high-profile executive, journalist, whistleblower, cybersecurity professional, or government contractor, ensuring that conversations, data, and activities remain confidential can prevent unauthorized access, espionage, or surveillance.

Although the shielded enclosure apparatus and systems are shown and described herein with certain components and functionality, other embodiments of the shielded enclosure apparatus and systems may include fewer or more components to implement less or more functionality.

Some embodiments of the shielded enclosure apparatus and systems are portable or mobile. The outer box may be a shipping container or ISO container which allows for the shielded enclosure apparatus to be transported to different locations in a manner similar to any traditional shipping container. The configuration of the outer box and the inner box including the post and beams at the top four corners allows for the portability of the overall system.

Some embodiments of the shielded enclosure apparatus are designed to ensure the RF attenuation and the STC rating are not compromised during transportation of the shielded enclosure system.

In some embodiments, the inner box may be constructed so as to be inserted into the outer box or shipping container with various components between the outer box and the inner box. In some embodiments, the inner box will rest on the floor of the outer box with an insulating material between the inner box and the floor of the outer box. In some embodiments, the insulating material is a sub-floor that separates the inner box and the outer box. In some embodiments, the insulating material is a non-metallic board that sits between the inner box and the floor of the outer box. The insulating material is configured to separate the inner box from the outer box mechanically and electrically such that any signal energized on the inner box is not transferred to the outer box and amplified.

While the base of the inner box is configured to rest on the sub-floor that is between the inner box and the outer box, the remaining sides of the inner box are separated from the outer box by various intermediary components described below. Throughout this description, the phrase "remaining sides" will refer to all sides except for the bottom side (also referred to as floor) of the inner box. These intermediary components are illustrative and may or may not be present in all embodiments and implementations of the invention. In some embodiments, there is an air gap between the outer box and the inner box. In some embodiments, the air gap is configured to function as a dielectric or insulating area that separates the inner box from the outer box on the remaining sides mechanically and electrically such that any signal energized on the inner box is not transferred to the outer box and/or amplified on the outer box. As explained more fully below, the air gap may additionally allow for the inner box and the outer box to be separately or independently grounded.

In some embodiments, there are additional components between the inner box and the outer box. In many embodiments, the outer box is a metallic material. In some embodiments, the outer box has a substance or coating on the interior surface of the outer box. Although referred to as a coating herein, in some embodiments, the coating may be a non-metallic board that ensures that no metal-to-metal contact occurs with the interior surface of the outer box and other components (most especially the inner box). In some embodiments, the coating is merely a non-metallic substance. In some embodiments, the coating could be paint. The coating is configured to restrict metal-to-metal contact such that the various components of the apparatus do not amplify errant signals originating within the interior workspace.

In some embodiments, the shielded enclosure apparatus and systems include a metallic mesh abutting the coating. The metallic mesh, for example, may include copper, brass nickel, aluminum, steel, stainless steel, or hardened steel. In some embodiments, the metallic mesh may surround and/or enclose the remaining sides of the inner box with the air gap between the copper mesh and the exterior surface of the inner box.

Returning to the inner box, the inner box may be, in some embodiments, comprised of various subcomponents. In an illustrative embodiment, the inner box is comprised of a plurality of panels and posts that are coupled together (such as continuously welded together), where each panel or post comprises an inner subpanel that forms the interior surface of the inner box and an outer subpanel that forms the exterior surface of the inner box with a gap between the inner subpanel and the outer subpanel. House in the gap between the inner subpanel and the outer subpanel is acoustic insulation. In some embodiments, the acoustic insulation is insulating material that is configured to dampen or restrict acoustic vibrations from exiting the interior workspace to the surrounding environment.

To illustrate more clearly the order and relative position of the various components, an example embodiment is described in this paragraph. In the illustrative embodiment, the interior workspace is separated from the surrounding environment by an inner subpanel and, in succession, acoustic insulation, an outer subpanel, an air gap, copper mesh, coating, and outer box.

The various components and features described herein work together to protect from radio frequency (RF) interception that emanates from or is produced within the inner box. RF interception occurs when adversaries use specialized equipment to capture or intercept electromagnetic transmissions emitted by electronic devices, including computers, phones, and communication systems. This type of surveillance can lead to severe security breaches, making it essential to implement protective measures. Embodiments described herein help reduce or eliminate radio frequency (RF) interception. In some cases, electromagnetic protection (or RF attenuation) is provided between 9 kHz and 40 GHz, 9 MHz and 40 GHz, or 9 MHz and 20 GHz.

The various components and features described herein work together to protect against sound transmission and other acoustics. Sound Transmission Control (STC) refers to the methods used to prevent sound from traveling outside a designated area, reducing the risk of eavesdropping or unauthorized listening. In some cases, the STC rating may be 40 or above such as, for example, 55 or above. In some cases, the STC rating may be 40, 45, 50, 55, 65, 70, etc.

The interior workspace is accessible via doors or areas of ingress/egress on the outer box and the inner box. In some embodiments, the outer box includes at least one door or area of ingress/egress for a user. In some embodiments, the area of ingress/egress is an outer box door (also referred to as a container door or second shield line exterior door).

In some embodiments, the inner box includes at least one door or area of ingress/egress for a user. In some embodiments, the inner box can include at least two doors or areas of ingress/egress for a user, including an outer door and an inner door. The doors can be any kind of door such as, for example, a door disclosed in copending patent application titled Shielded Enclosure Door filed May 15, 2025, patent application Ser. No. 19/209,701 the entirety of which is incorporated by reference into this document in its entirety.

In some embodiments, a vestibule or space between the inner door and the outer door can be included. In some embodiments, the vestibule can be a mechanical area or equipment area. Housed within the vestibule can be various systems including a power box that provides power to the interior workspace, an air exchanger that provides fresh air to the interior workspace, and other electrical equipment.

FIG. 1 depicts a perspective view of the exterior of the shielded enclosure apparatus 100 according to one or more embodiments of the invention. Although the shielded enclosure apparatus 100 is shown and described with certain components and functionality, other embodiments of the shielded enclosure apparatus 100 may include fewer or more components to implement less or more functionality.

In the illustrated embodiment, the shielded enclosure apparatus 100 appears from the outside as an ISO container. An ISO container, also known as an intermodal or shipping container, is a standardized metal box used for transporting goods across different modes of transport, such as ships, trucks, and trains, without needing to unload and reload the cargo. These containers are built to specific dimensions and strength standards set by the International Organization for Standardization (ISO) to ensure efficiency and safety in shipping. In the illustrated embodiment, the ISO container functions as a six-sided box that functions as the outer box 110 of the shielded enclosure apparatus 100. In the illustrated embodiment, the outer box 110 is a six-sided welded enclosure with a single point of access through outer box doors 120.

Although the shielded enclosure apparatus 100 is shown as a six-sided rectangular prism similar to a shipping container, the shielded enclosure apparatus 100 may be constructed in different shapes and sizes which are not shown only for the sake of brevity. In some embodiments, the outer box 110 is a metallic box sealed and impenetrable on all sides but the single access side. In the illustrated embodiment, the outer box 110 is made of 14 gauge steel that is welded to create an enclosure. The outer box 110, in conjunction with some of the other features described herein work together to provide a shielded enclosure that blocks, attenuates, or reduces radio frequency signals and other electromagnetic transmissions as well as vibrational waves such as sound waves, acoustic waves or audio waves.

Figure 2:
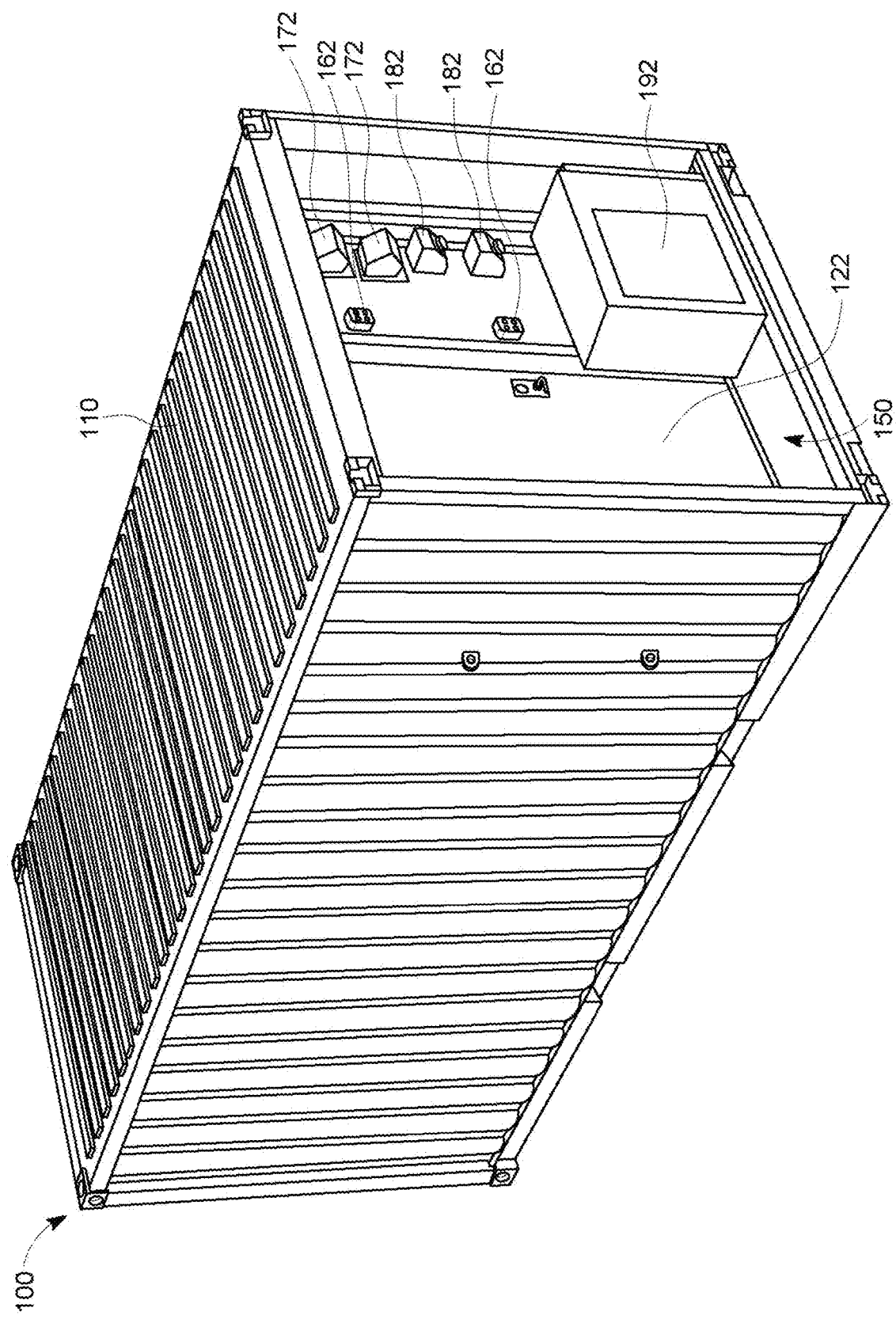
FIG. 2 is a perspective cutaway view of a shielded enclosure system showing the entry vestibule according to some embodiments.

FIG. 2 is a perspective cutaway view of a shielded enclosure system showing a vestibule area just inside the outer box doors 120 according to some embodiments. The illustrated embodiment shows a vestibule 150 (sometimes referred to as a vestibule area, outer entrance area, outer access point area). The vestibule 150 is a small area between the outer box 110 and the inner box (more fully described in subsequent figures) that may be used to house equipment needed for the shielded enclosure apparatus 100. The equipment described herein may be present in some but not all embodiments.

In the illustrated embodiment, the vestibule serves as the only access point to the interior workspace for a few primary sets of equipment: communications, power, heat, and air. In the illustrated embodiment, a heat exchanger 192 is shown in the vestibule 150. The heat exchanger 192 may serve as a system to transfer heat and maintain a suitable temperature within the interior workspace. As has been discussed, the shielded enclosure apparatus 100 may be transportable or mobile and may be moved to different locations and in vastly different climates and may need to maintain a suitable temperature within the interior workspace to preserve and maintain equipment.

The illustrated embodiment also shows air exchanger ports 172 which may serve to maintain fresh air within the interior workspace of the shielded enclosure apparatus. The illustrated embodiment also shows power ports 182 that may be used to port power into the interior workspace of the shielded enclosure apparatus. The illustrated embodiment further shows receptacles 162 which may be used to pass communication cables or other communications equipment into or out of the interior workspace of the shielded enclosure apparatus.

The illustrated embodiment also shows an outer door 122 (also called herein outer door of the inner box, outer door of the first shield line, or interior box outer door). The outer door 122 acts as an access point to the interior workspace and may include features similar to those shown on the remaining sides of the inner box.

Figure 3:
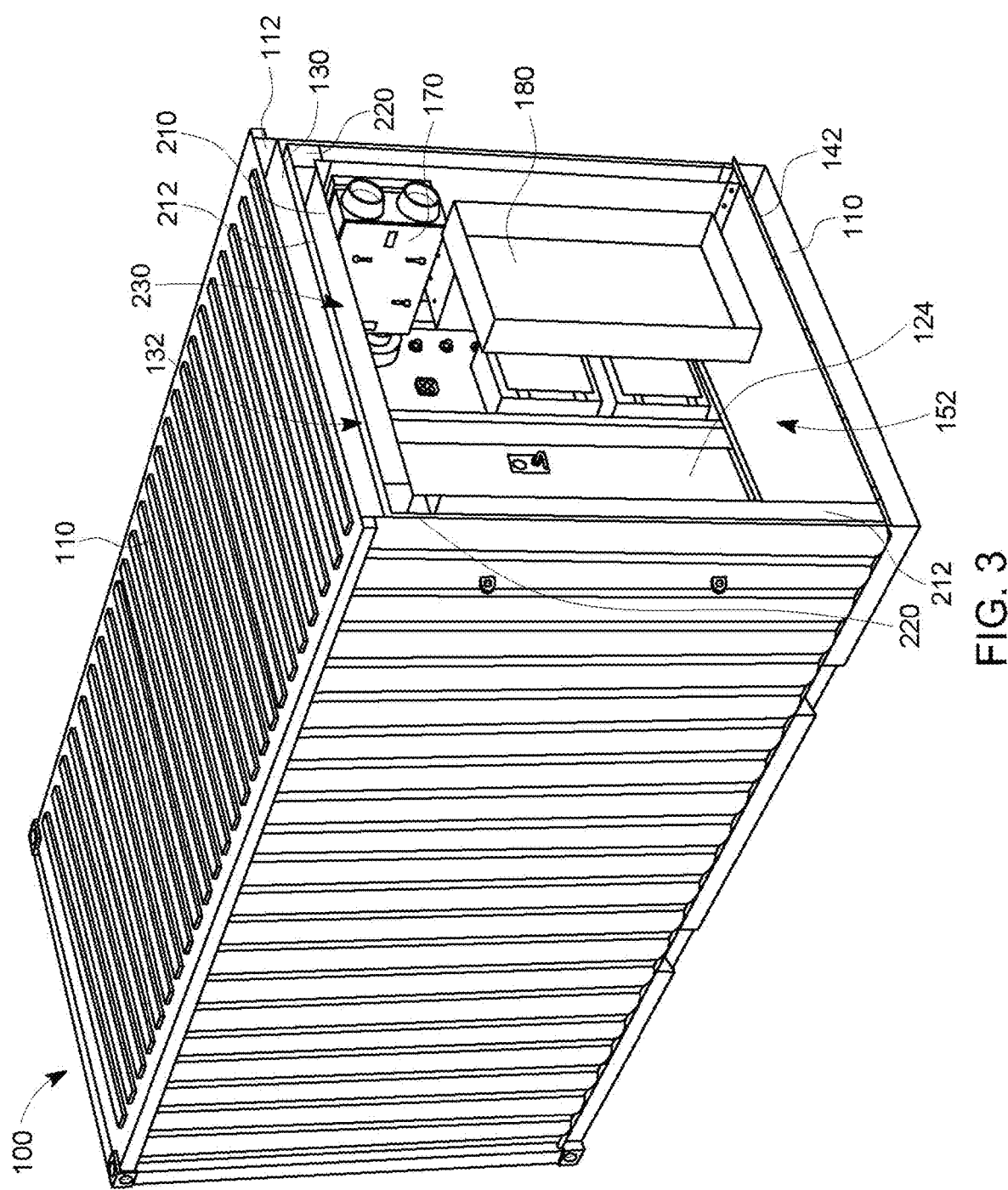
FIG. 3 is a perspective view of a shielded enclosure system showing the according to some embodiments.

FIG. 3 is a perspective cutaway view of a shielded enclosure system showing the area within the outer door according to some embodiments. The illustrated embodiment shows a separate technical boundary 152 (sometimes referred to as a technical area, inner entrance area, inner access point area. The technical boundary 152 is a small area between the outer door 122 and an inner door 124 of the inner box that may be used to house more equipment needed for the shielded enclosure apparatus 100. The equipment described herein may be present in some but not all embodiments.

In the illustrated embodiment, the inner entrance area serves as the only access point to the interior workspace for a few primary sets of equipment. The illustrated embodiment also shows an inner door 124 (also called herein inner door of the inner box, inner door of the first shield line, or interior box inner door). The inner door 124 acts as an access point to the interior workspace and may include features similar to those shown on the remaining sides of the inner box. Because the overall access to the interior workspace may serve as a potential spot for eavesdropping access, the multi-layered entrance has been shown with outer container doors 120, followed by outer door 122, and further followed by inner door 124 which are used to access the interior workspace. The inner door 124 and the outer door 122 work as a double door configuration with a space between to reduce, dampen, or eliminate leakage of the sound waves from the interior workspace to the exterior of the shielded enclosure apparatus 100.

The separate technical boundary 152 may not be completely shielded for sound waves as it is outside the inner door but is shielded on all six sides from electromagnetic transmissions. The illustrated embodiment also shows an air exchanger 170 which may serve to maintain fresh air within the interior workspace of the shielded enclosure apparatus. The air exchanger 170 is positioned to mix fresh air with return air, improving conditioning efficiency within the interior workspace. The air exchanger 170 may be the only means of introducing fresh air into the interior workspace. In some embodiments, the air exchanger 170 employs silencers and/or waveguides (such as honeycomb waveguides) to prevent electromagnetic escape or intrusion. The silencers and/or waveguides, for example, may include a honeycomb pattern. The silencers and/or waveguides, for example, may be made from brass, aluminum, steel, nickel, stainless steel, hardened steel, or any other metal. The honeycomb pattern, for example, may have a cell size with at least a first dimension of between $1/16$" to 1" and second dimension of between $1/2$ to 3" such as, for example, a first dimension of $1/8$" and a second dimension of 1"; although, various other sizes may be used. Alternatively, other patterns with cells could be, such as, for example, a circular, triangular, rectangular, or wavy pattern with similarly cells as mentioned in the previous sentence.

The illustrated embodiment also shows a power filter 180 that may be used to filter and supply power into the interior workspace of the shielded enclosure apparatus. All power supplying the shielded enclosure apparatus 100 is routed through the power filter 180, which is specifically rated for the shielded enclosure apparatus's power requirements. The illustrated embodiment further shows receptacles which may be used to pass communication cables or other communications equipment into or out of the interior workspace of the shielded enclosure apparatus. The power filter, for example, may include an inline, low pass power filter. The power filter, for example, may include only passive components. The power filter, for example, may strip off the noise by flipping the polarity.

In the cutaway view of the shielded enclosure apparatus 100, a cross section of the inner box and the outer box 110 and various components between is shown. The inner box (also called herein an interior box, interior metallic box, inner shield line, shielded interior, or shield line interior box) is separated from the outer box 110 by an air gap 132 and other components. The air gap 132 exists between the inner box and the outer box and allows for the separate grounding of the two boxes. That is, the inner box may be grounded to a separate location from the outer box. This break keeps dielectric separation between the two boxes and reduces or eliminates transfer of electromagnetic transmissions or sound waves from the inner box to the outer box.

In the illustrated embodiment, the inner box is a metal welded enclosure made up of panels and posts 220 (sometimes referred to as a steel structural frame or structural frame) that are continuously welded to provide a sealed enclosure. The panels comprise an inner panel 210 (also referred to as a metal sheet) and an outer panel 212 (also referred to as a second metal sheet) that are separated from each other by acoustic insulation 230. The inner and outer panels may be secured together but have the acoustic insulation 230 housed between them.

Either or both the inner panel or the outer panel may include any portion of a panel disclosed in copending patent application titled Shielded Enclosure Panel filed May 15, 2025, Patent application Ser. No. 19/209,688 the entirety of which is incorporated by reference into this document in its entirety.

In the illustrated embodiment, the shielded interior is a box constructed from four-inch depth panels of 14-gauge steel (for the outer panel 212 and the inner panel 210) filled with acoustic insulation between. These panels may be made from other gauges of steel such as, for example, 10-gauge, 12-gauge, 16-gauge, 18-gauge, etc. Alternatively, these panels may be made from aluminum of any of the disclosed or other gauges. In some embodiments, the acoustic insulation 230 may include mineral wool or a metallic insulation material. As explained previously, the inner box is non-metallically separated from the outer box or ISO container. To achieve this separation, the interior of the outer box 110 is coated with a non-metallic coating 112 to prevent any metal-to-metal contact. The non-metallic coating 112 is three millimeters thick and serves as a barrier to eliminate bare metal exposure on the interior surface of the outer box 110. In some embodiments, the non-metallic coating 112 may be a non-metallic paint. In other embodiments, any non-metallic coating could be used for the purpose of preventing metal-to-metal contact.

Referring to the inner box, this shielded box acts as the primary shield line (or first shield line) and is independently grounded from the exterior or outer box. In the illustrated embodiment, the panels are set in place and continuously welded on all sides to the steel structural frame. In some embodiments, the steel structural frame may be 8-gauge steel, 10-gauge steel, 12-gauge steel, 14-gauge steel, 16-gauge steel, etc. After assembly of the inner box, the entire inner box may be slid into the outer box or ISO container using guide rails, ensuring perfect alignment with the exterior walls and roof and ensuring an air gap 132 between the inner and outer box.

Referring now to the floor or bottom of the inner and outer boxes, it is also designed for non-metallic separation between the two boxes. In the illustrated embodiment, there is a non-metallic base floor 142 between the outer box 110 and the metal bottom of the inner box. The non-metallic base floor prevents any metal-to-metal contact between the floors of the two boxes. In some embodiments, the non-metallic base floor is made of wood. In an embodiment, the non-metallic base floor is a plywood base followed by a layer of steel (e.g., 8-gauge steel, 10-gauge steel, 12-gauge steel, 14-gauge steel, 16-gauge steel, etc.) for the floor of the inner box. Structurally, the sequence from bottom to top on the floor includes the outer box 110, a layer of wood (the non-metallic base floor 142), and the floor of the inner box (a layer of steel).

In some embodiments, there is an additional layer between the inner box and the outer box. In the illustrated embodiment, there is a mesh 130 just inside of the non-metallic coating 112 on the interior surface of the outer box 110. In some embodiments, the metallic mesh is a copper mesh layered against the coating (the coating separating the metal surface of the outer box and the mesh 130. The metallic mesh addresses any residual reflective energy from the interior box. The shielded enclosure apparatus 100 uses the double shield line so that any residual reflective energy or sound that might escape the inner box (or first shield line) may be attenuated, grounded, or blocked by the outer box (or second shield line). This allows for electromagnetic transmission rated and STC rated shielded enclosure with the inner box and the outer box separately or independently grounded and working together to control electromagnetic transmissions and acoustics and reduce or eliminate any potential eavesdropping within the shielded enclosure apparatus 100. In some cases, the shielded enclosure apparatus 100 can shield frequencies between 9 MHz and 20, 9 kHz and 40 GHz, 9 MHz and 40 GHz. The shielded enclosure apparatus 100 may further have an STC rating of 55 and control between 100 and 120 decibels of sound.

Figure 4:
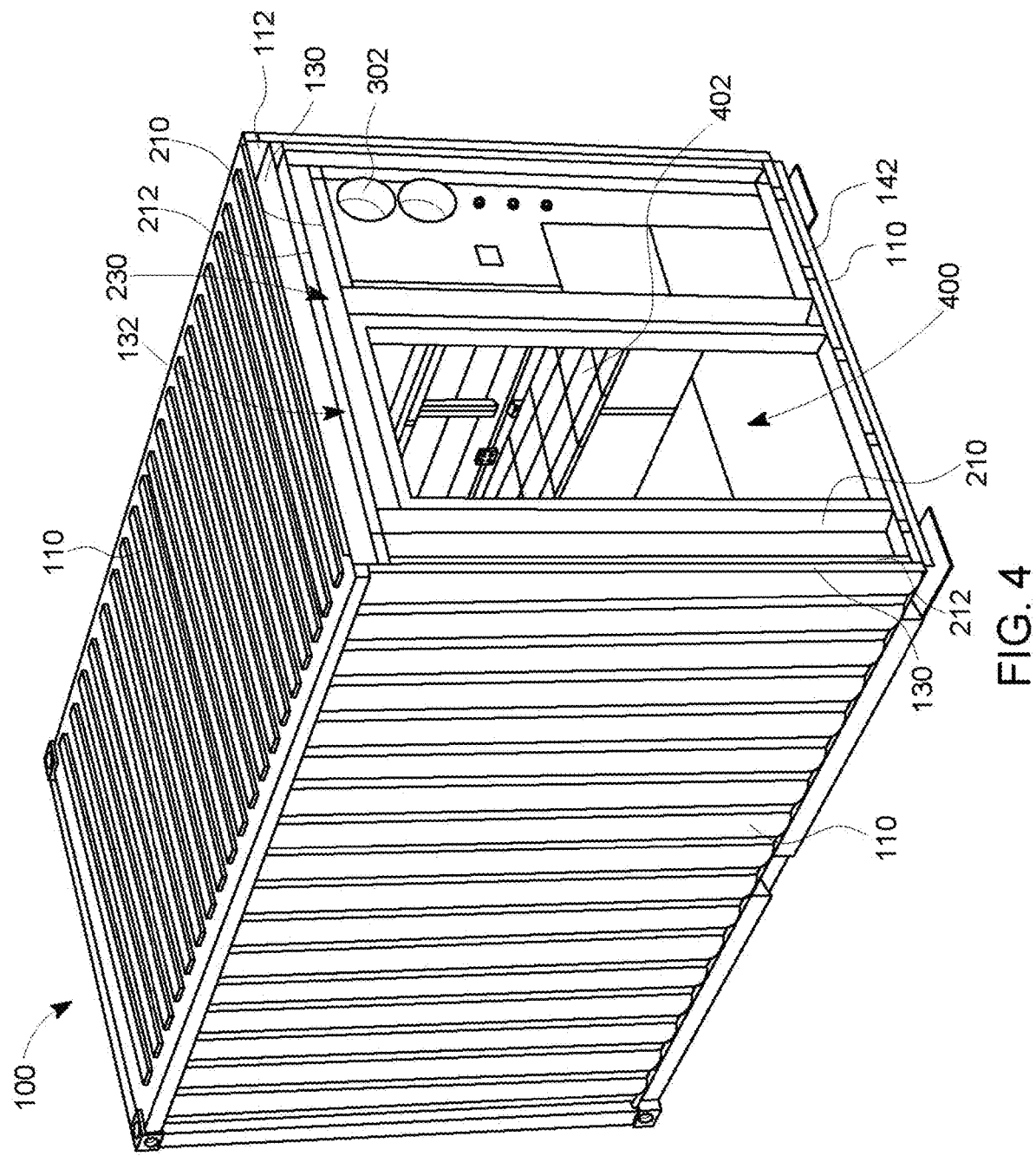
FIG. 4 is a perspective view of a shielded enclosure system according to some embodiments.

FIG. 4 is a perspective cutaway view of a shielded enclosure system showing a portion of the interior workspace according to some embodiments. The cutaway view eliminates the inner door 124 and shows the interior workspace 400 (alternatively called a work area, production space, or protected area) that the shielded enclosure apparatus is protecting from the surrounding environment.

The illustrated embodiment further shows various ports 302 that allow for the ingress/egress of the equipment/systems described previously including the communications, power, heat, and air systems. Within the interior workspace 400, there may be additional equipment, cabinetwork, or amenities as needed. In the illustrated embodiment, a desk space 402 is shown where a user can set up within the interior workspace 400.

As before, in this cutaway view of the shielded enclosure apparatus 100, a cross section of the inner box and the outer box 110 and various components between is shown. The inner box is separated from the outer box 110 by an air gap 132 and other components. The air gap 132 exists between the inner box and the outer box and allows for the separate grounding of the two boxes. As before, the inner box is a metal welded enclosure made up of panels secured to the structural frame that are continuously welded. The panels comprise an inner metal sheet and an outer metal sheet that are separated from each other by acoustic insulation 230. The inner box is non-metallically separated from the outer box. The interior of the outer box 110 is coated with a non-metallic coating 112 to prevent any metal-to-metal contact. The non-metallic coating 112 can serve as a barrier to eliminate bare metal exposure on the interior surface of the outer box 110.

Referring to the inner box, this shielded box acts as the primary shield line (or first shield line) and is independently grounded from the exterior or outer box. The grounding allows for grounding of reflective energy and signals on the inner box to be grounded in a separate location from the outer box. Separate grounding allows for separate attenuation and makes it so the outer box does not amplify or extend any signal that makes it to the inner box. The floors are separated by the non-metallic base floor 142 between the outer box 110 and the metal bottom of the inner box. The non-metallic base floor prevents any metal-to-metal contact between the floors of the two boxes and supports the separate grounding of the inner box from the outer box.

In the illustrated embodiment, the mesh 130 just inside of the non-metallic coating 112 on the interior surface of the outer box 110 is present and can further address any residual reflective energy from the interior box. The shielded enclosure apparatus 100 uses double shield lines so that any residual reflective energy or sound that might escape the inner box (or first shield line) may be attenuated, grounded, or blocked by the outer box (or second shield line).

Figure 5:
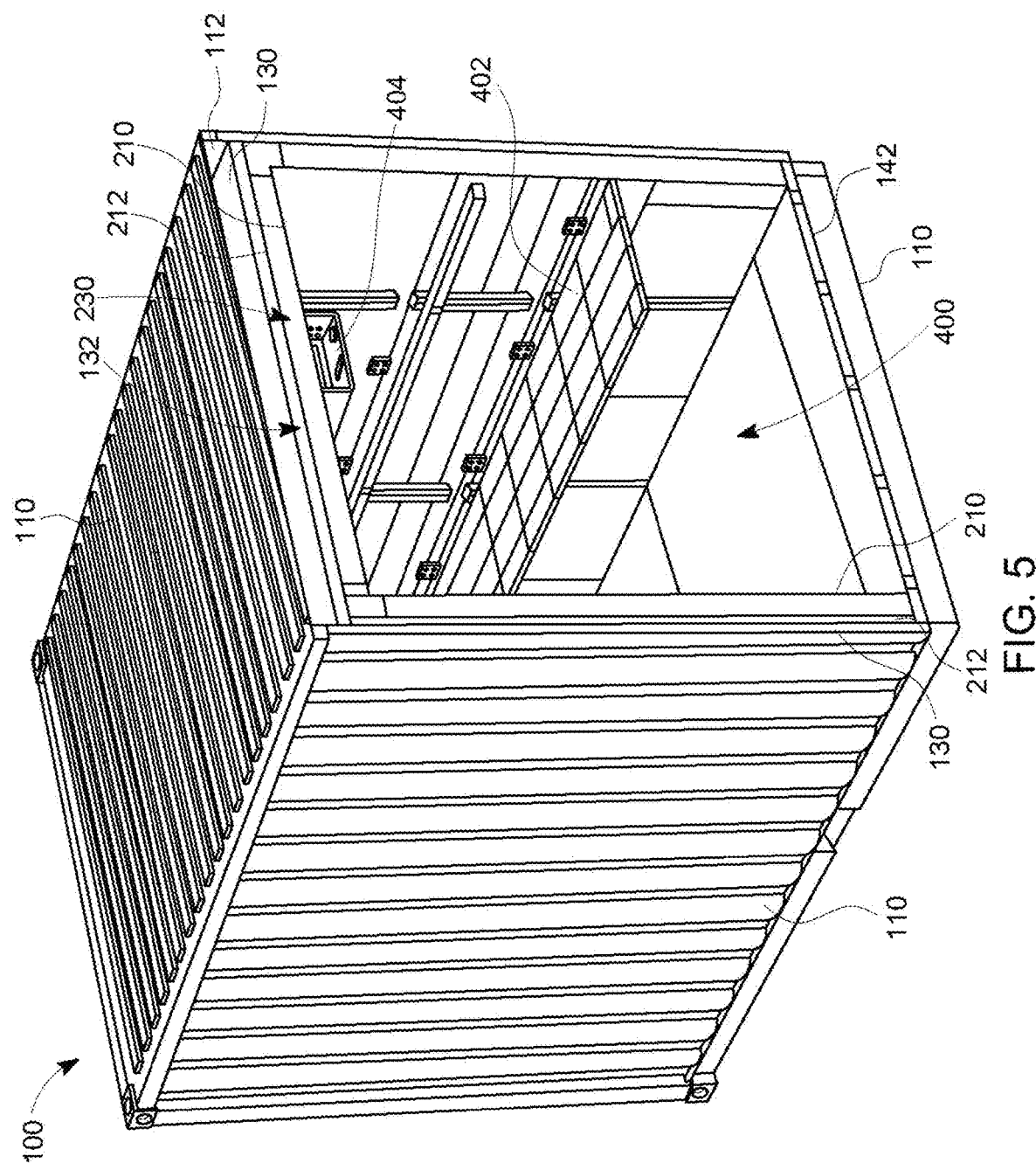
FIG. 5 is a perspective view of a shielded enclosure system according to some embodiments.
Figure 6:
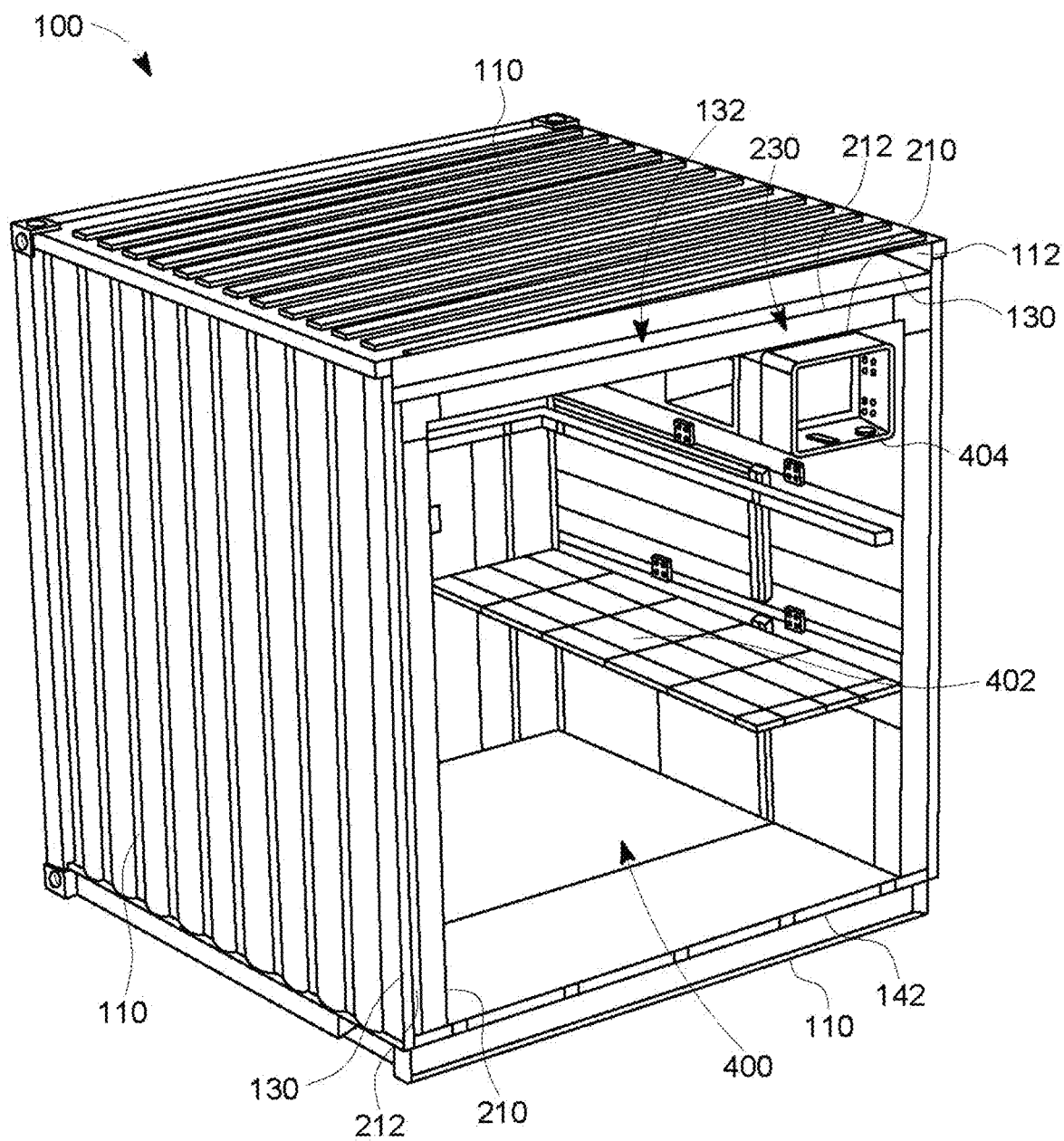
FIG. 6 shows a perspective view of a shielded enclosure system according to some embodiments.

FIG. 5 is a perspective cutaway view of a shielded enclosure system showing a portion of the interior workspace according to some embodiments. The cutaway view eliminates one side of the inner box and shows the interior workspace 400 that the shielded enclosure apparatus is protecting from the surrounding environment. FIG. 6 shows a perspective cutaway view of the shielded enclosure system deeper into the interior workspace.

The illustrated embodiment further shows a desk space 402 is shown where a user can set up within the interior workspace 400 and cabinets 404 that can be used to house electronic equipment or other equipment as needed. The cabinets 404 are separated from the interior surface of the inner box so as to not attenuate any signal from the electronic equipment in the cabinet to the inner box.

As before, in this cutaway view of the shielded enclosure apparatus 100, a cross section of the inner box and the outer box 110 and various components between is shown. The inner box is separated from the outer box 110 by an air gap 132 and other components. The air gap 132 exists between the inner box and the outer box and allows for the separate grounding of the two boxes. As before, the inner box is a metal welded enclosure made up of panels secured to the structural frame that are continuously welded. The panels comprise an inner metal sheet and an outer metal sheet that are separated from each other by acoustic insulation 230. The inner box is non-metallically separated from the outer box. The interior of the outer box 110 is coated with a non-metallic coating 112 to prevent any metal-to-metal contact. The non-metallic coating 112 serves as a barrier to eliminate bare metal exposure on the interior surface of the outer box 110.

Referring to the inner box, this shielded box acts as the primary shield line (or first shield line) and is independently grounded from the exterior or outer box. The grounding allows for grounding of reflective energy and signals on the inner box to be grounded in a separate location from the outer box. Separate grounding allows for separate attenuation and makes it so the outer box does not amplify or extend any signal that makes it to the inner box. The floors are separated by the non-metallic base floor 142 between the outer box 110 and the metal bottom of the inner box. The non-metallic base floor prevents any metal-to-metal contact between the floors of the two boxes and supports the separate grounding of the inner box from the outer box.

In the illustrated embodiment, the metallic mesh 130 just inside of the non-metallic coating 112 on the interior surface of the outer box 110 is present and can further address any residual reflective energy from the interior box. The shielded enclosure apparatus 100 uses double shield lines so that any residual reflective energy or sound that might escape the inner box (or first shield line) may be attenuated, grounded, or blocked by the outer box (or second shield line).

Figure 7:
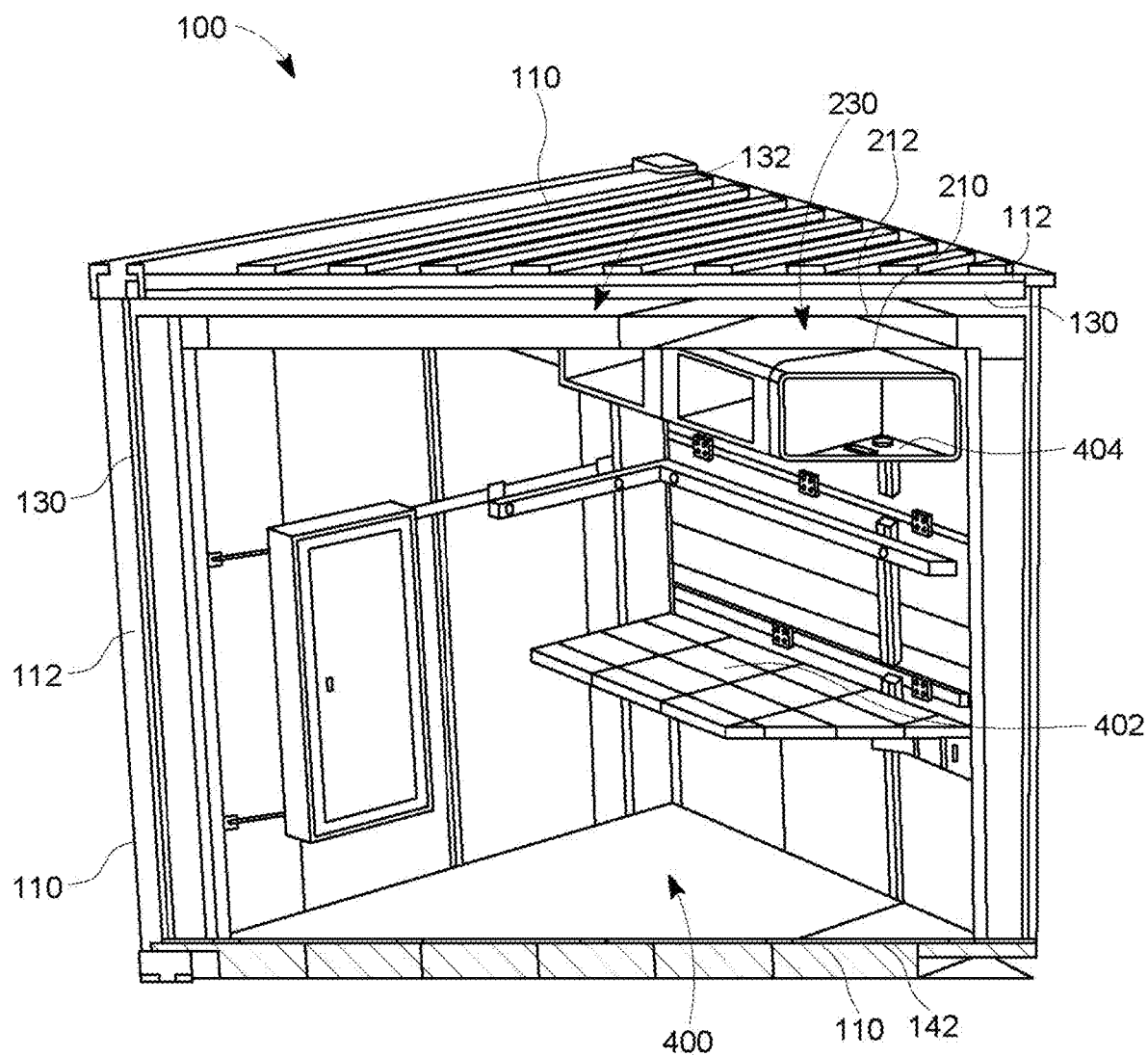
FIG. 7 is a perspective view of a shielded enclosure system according to some embodiments.

FIG. 7 is a perspective cutaway view of a shielded enclosure system with the cutaway at an angle. The illustrated embodiment further shows a desk space 402 is shown where a user can set up within the interior workspace 400 and cabinets 404 that can be used to house electronic equipment or other equipment as needed. The cabinets 404 are separated from the interior surface of the inner box so as to not attenuate any signal from the electronic equipment in the cabinet to the inner box.

As before, in this cutaway view of the shielded enclosure apparatus 100, a cross section of the inner box and the outer box 110 and various components between is shown. The inner box is separated from the outer box 110 by an air gap 132 and other components. The air gap 132 exists between the inner box and the outer box and allows for the separate grounding of the two boxes. As before, the inner box is a metal welded enclosure made up of panels secured to the structural frame that are continuously welded. The panels comprise an inner metal sheet and an outer metal sheet that are separated from each other by acoustic insulation 230. The inner box is non-metallically separated from the outer box. The interior of the outer box 110 is coated with a non-metallic coating 112 to prevent any metal-to-metal contact. The non-metallic coating 112 serves as a barrier to eliminate bare metal exposure on the interior surface of the outer box 110.

Referring to the inner box, this shielded box acts as the primary shield line (or first shield line) and is independently grounded from the exterior or outer box. The grounding allows for grounding of reflective energy and signals on the inner box to be grounded in a separate location from the outer box. Separate grounding allows for separate attenuation and makes it so the outer box does not amplify or extend any signal that makes it to the inner box. The floors are separated by the non-metallic base floor 142 between the outer box 110 and the metal bottom of the inner box. The non-metallic base floor prevents any metal-to-metal contact between the floors of the two boxes and supports the separate grounding of the inner box from the outer box.

In the illustrated embodiment, the mesh 130 just inside of the non-metallic coating 112 on the interior surface of the outer box 110 is present and can further address any residual reflective energy from the interior box. The shielded enclosure apparatus 100 uses double shield lines so that any residual reflective energy or sound that might escape the inner box (or first shield line) may be attenuated, grounded, or blocked by the outer box (or second shield line).

Figure 8:
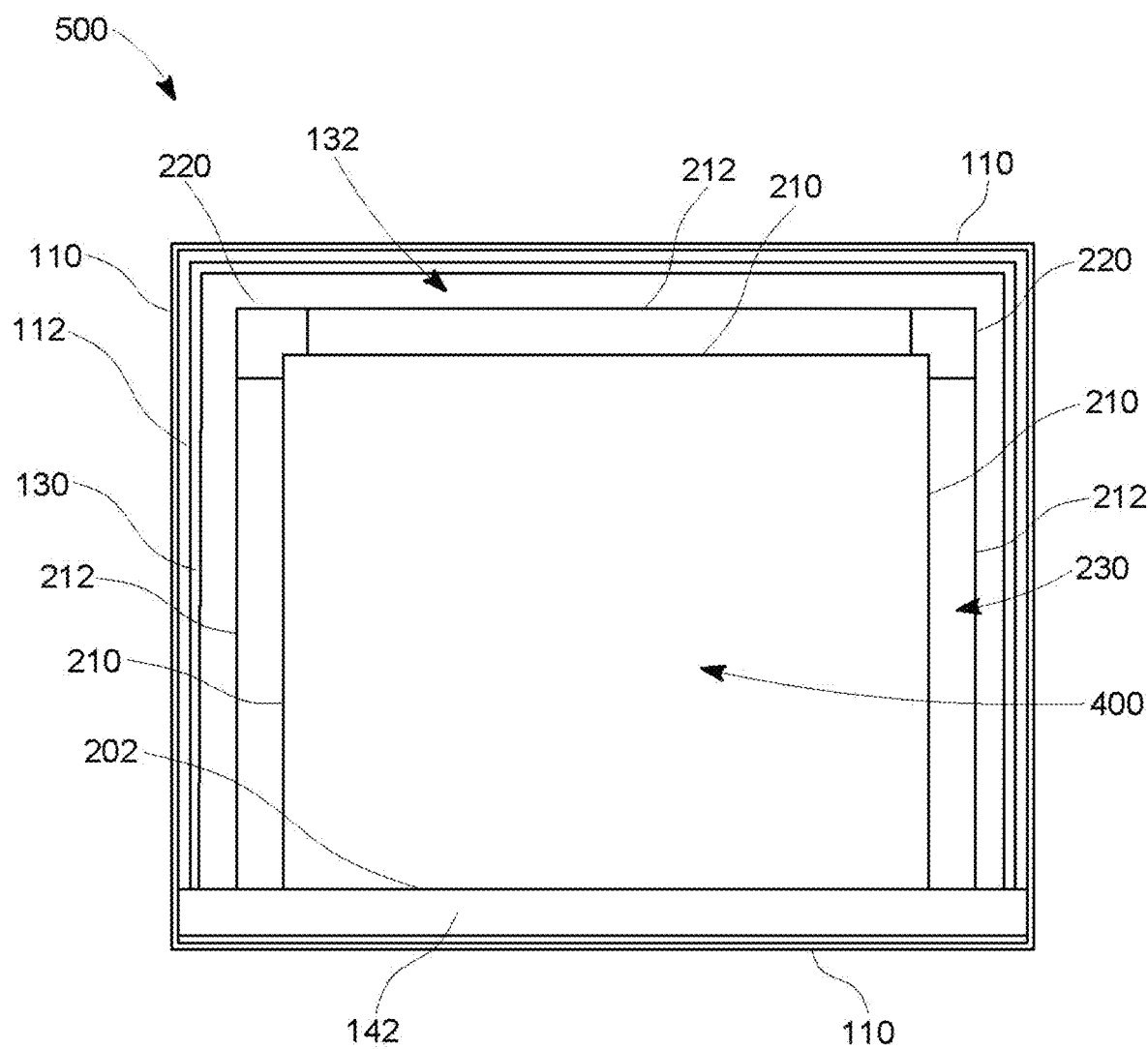
FIG. 8 is a schematic diagram of a cross section of a shielded enclosure system according to some embodiments.

FIG. 8 is a schematic diagram 500 of a cross section of a shielded enclosure system according to some embodiments. The schematic diagram shows the general configuration and should not be used to interpret the general sizes of the different components and layers. The shielded enclosure apparatus and system is used separate the interior workspace 400 (alternatively called a work area, production space, or protected area) from a surrounding environment and further prevent eavesdropping from outside the shielded enclosure apparatus. The shielded enclosure apparatus includes generally two boxes, an outer box 110 and an inner box that work together to separate and enclose the interior workspace 400 from the surrounding environment. The outer box 110 surrounds and encloses the inner box. The outer box 110 includes at least one door or area of ingress/egress to access the inner box. The inner box surrounds and encloses the interior workspace 400. The inner box includes at least one door or area of ingress/egress to access the interior workspace 400.

The interior workspace 400 may be used for any work or communications that require isolation from a surrounding area that may be subject to sophisticated surveillance technologies. Any type of work may be conducted within the interior workspace 400. The interior workspace 400 may include computer terminals or other types of electronic devices upon which a user can conduct work that is intended to be kept secret or isolated from the surrounding environment.

In some embodiments of the shielded enclosure apparatus and systems, the apparatus is portable or mobile. The outer box 110 may be a shipping container or ISO container which allows for the shielded enclosure apparatus to be transported to different locations in a manner similar to any traditional shipping container.

In some embodiments, the inner box may be constructed so as to be inserted into the outer box with various components between the outer box and the inner box. In the illustrated embodiment, the inner box rests on the floor of the outer box with an insulating material (or non-metallic base floor 142) between the inner box and the floor of the outer box. In some embodiments, the insulating material is a sub-floor that separates the inner box and the outer box. In some embodiments, the insulating material is a non-metallic board that sits between the inner box and the floor of the outer box. The insulating material is configured to separate the inner box from the outer box mechanically and electrically such that any signal energized on the inner box is not transferred to the outer box and amplified. In some embodiments, the base floor is a wood floor or plywood.

While the base of the inner box is configured to rest on the sub-floor that is between the inner box and the outer box 110, the remaining sides of the inner box are separated from the outer box 110 by various intermediary components. "Remaining sides" will refer to all sides except for the bottom side (also referred to as floor) of the inner box. In some embodiments, there is an air gap 132 between the outer box 110 and the inner box. In some embodiments, the air gap 132 is configured to function as a dielectric or insulating area that separates the inner box from the outer box 110 on the remaining sides mechanically and electrically such that any signal energized on the inner box is not transferred to the outer box 110 and/or amplified on the outer box 110. The air gap 132 may additionally allow for the inner box and the outer box 110 to be separately grounded.

In the illustrated embodiment, the outer box 110 has a substance or coating non-metallic 112 on the interior surface of the outer box 110. In some embodiments, the coating may be a non-metallic board that ensures that no metal-to-metal contact occurs with the interior surface of the outer box 110 and other components (most especially the inner box). In some embodiments, the non-metallic coating 112 is merely a non-metallic substance. In some embodiments, the non-metallic coating 112 can be a non-metallic paint. The non-metallic coating 112 is configured to restrict metal-to-metal contact such that the various components of the apparatus do not amplify errant signals originating within the interior workspace 400.

In some embodiments, the shielded enclosure apparatus 100 include a mesh 130 (e.g., a metal mesh, a copper mesh, or a brass mesh) abutting the coating. In some embodiments, the mesh 130 further surrounds and encloses the remaining sides of the inner box with the air gap between the copper mesh and the exterior surface of the inner box. In some embodiments, the mesh 130 surrounds all sides of the inner box.

The inner box may be, in some embodiments, comprised of various subcomponents. In the illustrated embodiment, the inner box is comprised of a plurality of panels 210, 212 and structural posts 220 that are coupled together. Housed in the gap between the inner panel or subpanel 210 and the outer panel or subpanel 212 is acoustic insulation 230. In some embodiments, the acoustic insulation 230 is insulating material that is configured to dampen or restrict acoustic vibrations from exiting the interior workspace to the surrounding environment.

In an illustrative embodiment (as shown in this figure), the interior workspace 400 is separated from the surrounding environment by an inner panel 210 and, in succession, acoustic insulation 230, an outer panel 212, an air gap 132, a mesh 130, a non-metallic coating 112, and an outer box 110.

Figure 9:
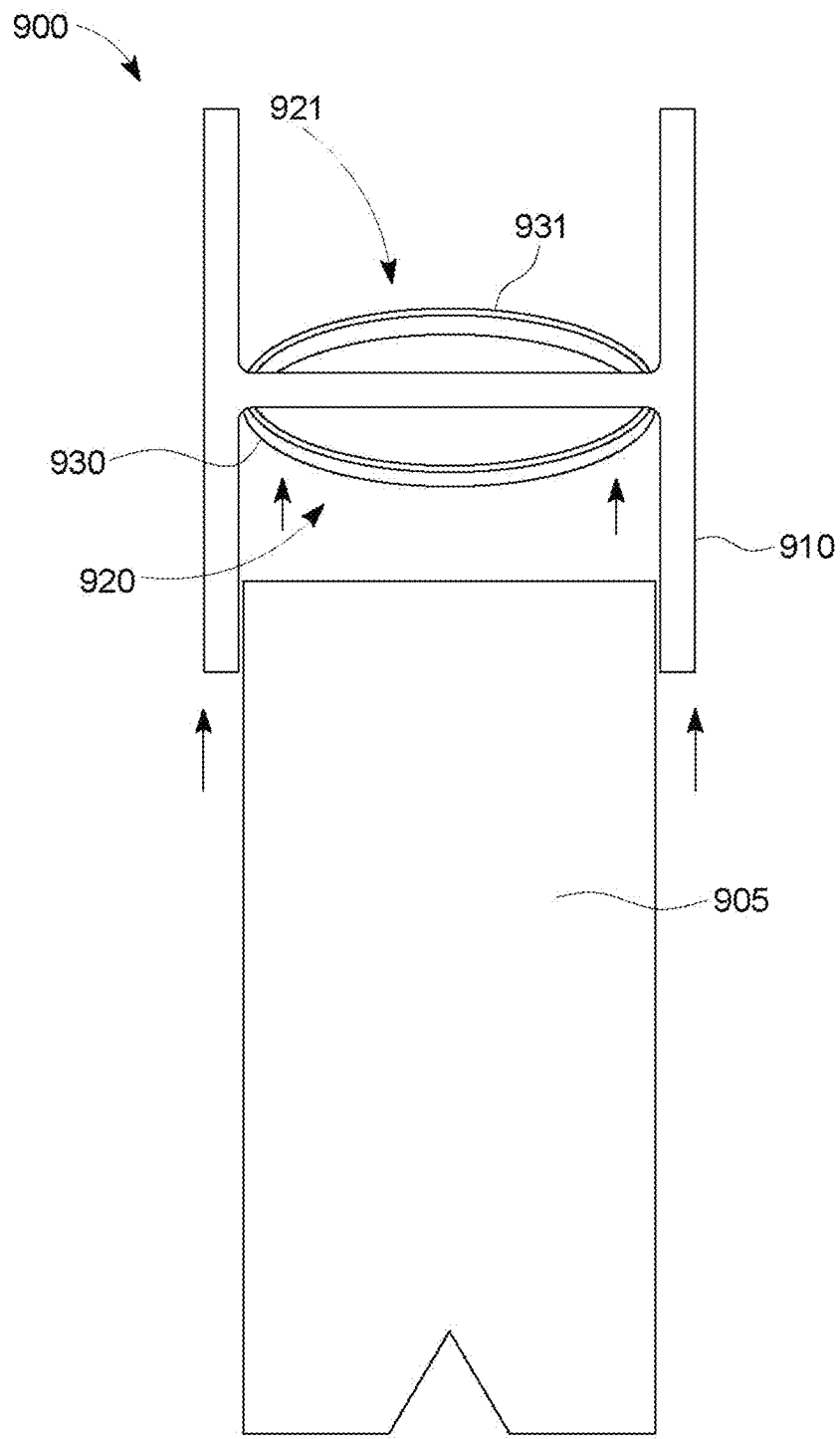
FIG. 9 is a schematic diagram of cross section of panel and I-beam construction according to some embodiments.

FIG. 9 is a schematic diagram of cross section of panel 905 and I-beam 910 construction arrangement 900 according to some embodiments. A shielded enclosure apparatus 100, for example, may be constructed from a plurality of panels 905 disposed between I-beams 910. Each panel 905, for example, may include a panel disclosed in copending patent application titled Shielded Enclosure Panel filed May 15, 2025, Patent application Ser. No. 19/209,688 the entirety of which is incorporated by reference into this document in its entirety A panel 905 may be coupled with I-beam 910 by sliding an end of the panel 905 into a gap 920 of the I-beam 910. A tension member 930 may be disposed within the gap 920. The tension member 930, for example, may comprise beryllium copper. The tension member 930, for example, may be compressed wen the panel 905 is slide into the gap 920. An I-beam 910 may be placed on opposite sides of a panel 920 and provide compression and/or tension and/or provide grounding contact between the I-beam 910 and the panel 905. The tension member 930, for example, may comprise beryllium copper. The I-beam 910, for example, may comprise 8, 10, or 12 gauge steel.

The width of the gap 920 may be 0.5, 0.75%, 1%, 1.25%, 1.5%, etc. greater than the width of the panel 905.

A second panel may be coupled with the I-beam by sliding an end of the second panel into the gap 921 of the I-beam 910. A second tension member 931 may be disposed within the gap 921. The second pap 921 may have the same properties as the gap 920. The second tension member 931 may have the same properties as the tension member 930.

The various components and features described herein work together to protect from radio frequency (RF) interception. Electromagnetic interception occurs when adversaries use specialized equipment to capture or intercept electromagnetic transmissions emitted by electronic devices, including computers, phones, and communication systems. This type of surveillance can lead to severe security breaches, making it essential to implement protective measures. Embodiments described herein help reduce or eliminate radio frequency (RF) interception. In some cases, electromagnetic protection is provided between 9 MHz and 20 GHz. In some cases, electromagnetic protection is provided in the RF range.

The various components and features described herein work together to protect against sound transmission and other acoustics. Sound Transmission Control (STC) refers to the methods used to prevent sound from traveling outside a designated area, reducing the risk of eavesdropping or unauthorized listening. In some cases, the STC rating is 55 or above.

The interior workspace is accessible via doors or areas of ingress/egress on the outer box and the inner box. In some embodiments, the outer box includes at least one door or area of ingress/egress for a user. In some embodiments, the area of ingress/egress is an outer box door (also referred to as a container door or second shield line exterior door).

In some embodiments, the inner box includes at least one door or area of ingress/egress for a user. In some embodiments, the inner box includes at least two doors or areas of ingress/egress for a user, including an outer door and an inner door. In some embodiments, there is a vestibule or space between the inner door and the outer door. In some embodiments, the vestibule can be a mechanical area or equipment area. Housed within the vestibule can be various systems including a power box that provides power to the interior workspace, an air exchanger that provides fresh air to the interior workspace, and other electrical equipment.

Unless otherwise specified, the term "substantially" means within 5% or 10% of the value referred to or within manufacturing tolerances. Unless otherwise specified, the term "about" means within 5% or 10% of the value referred to or within manufacturing tolerances.

The conjunction "or" is inclusive.

The terms "first", "second", "third", etc. are used to distinguish respective elements and are not used to denote a particular order of those elements unless otherwise specified or order is explicitly described or required.

Numerous specific details are set forth to provide a thorough understanding of the claimed subject matter. However, those skilled in the art will understand that the claimed subject matter may be practiced without these specific details. In other instances, methods, apparatuses or systems that would be known by one of ordinary skill have not been described in detail so as not to obscure claimed subject matter.

The use of "adapted to" or "configured to" is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for purposes of example rather than limitation, and does not preclude inclusion of such modifications, variations and/or additions to the present subject matter as would be readily apparent to one of ordinary skill in the art.

That which is claimed:

1. A shielded enclosure system comprising:
a double shield line enclosure comprising:
a first shield line interior box comprising:
an inner panel;
an outer panel; and
a gap between the inner panel and the outer panel;
a second shield line exterior box, wherein the first shield line interior box is separated from the second shield line exterior box by an air gap; and
a non-metallic coating on an interior surface of the second shield line exterior box.

2. The shielded enclosure system of claim 1, wherein the first shield line interior box and the second shield line exterior box are grounded to separate ground sources.

3. The shielded enclosure system of claim 1, wherein the first shield line interior box further comprises acoustic insulation within the gap between the inner panel and the outer panel.

4. The shielded enclosure system of claim 3, wherein the first shield line interior box further comprises an area of ingress/egress that comprises of an outer door separated from an inner door.

5. The shielded enclosure system of claim 1, wherein a floor of the first shield line interior box and a floor of the second shield line exterior box are separated by a non-metallic base floor.

6. The shielded enclosure system of claim 5, wherein the non-metallic base floor is a wood panel that separates the floor of the first shield line interior box and the floor of the second shield line exterior box.

7. The shielded enclosure system of claim 1, further comprising a metallic mesh between the non-metallic coating on the interior surface of the second shield line exterior box and the air gap.

8. The shielded enclosure system of claim 1, further comprising a metallic mesh abutting the coating on the interior surface of the outer metallic box.

9. The shielded enclosure system of claim 1, wherein the coating is a non-metallic paint.

10. A shielded enclosure system comprising:
an outer metallic box;
an inner metallic box enclosed within the outer metallic box, the inner metallic box enclosing an interior workspace;
wherein there is an air gap between the outer metallic box and the inner metallic box wherein the shielded enclosure system produces an electromagnetic transmission attenuation between 9 kHz and 40 gHz;
wherein the outer metallic box and the inner metallic box are grounded to separate ground sources.

11. The shielded enclosure system of claim 10, wherein the outer metallic box has a non-metallic coating covering an interior surface of the outer metallic box.

12. The shielded enclosure system of claim 10, wherein the outer box comprises an ISO container.

13. The shielded enclosure system of claim 10, further comprising a mesh between the outer metallic box and the inner metallic box.

14. The shielded enclosure system of claim 13, wherein the mesh comprises a metal.

15. The shielded enclosure system of claim 13, wherein the mesh abuts a coating on an interior surface of the outer metallic box.

16. The shielded enclosure system of claim 10, further comprising an air exchanger comprising a silencer or waveguide.

17. A shielded enclosure system comprising:
an outer metallic box;
an inner metallic box enclosed within the outer metallic box, the inner metallic box enclosing an interior workspace;
a waveguide disposed between the outer metallic box and the inner metallic box;
wherein the shielded enclosure system is arranged to produce an electromagnetic transmission attenuation between 9 kHz and 40 gHz and to produce an STC rating greater than 40;
wherein the outer metallic box and the inner metallic box are grounded to separate ground sources.

18. The shielded enclosure system of claim 17, wherein the outer metallic box and the inner metallic box are arranged to form an air gap between the outer metallic box and the inner metallic box.

19. The shielded enclosure system of claim 17, further comprising a metallic mesh disposed between the outer metallic box and the inner metallic box.

20. The shielded enclosure system of claim 17, wherein the outer metallic box has a non-metallic coating covering an interior surface of the outer metallic box.

21. The shielded enclosure system of claim 17, wherein the outer metallic box, the inner metallic box, and the waveguide are arranged to ensure the electromagnetic transmission attenuation and the STC rating are not compromised during transportation of the shielded enclosure system.

22. A shielded enclosure system comprising:
an outer metallic box grounded to a first grounding location; and an inner metallic box enclosed within the outer metallic box, the inner metallic box enclosing an interior workspace, the inner metallic box is grounded to a second grounding location that is separate and distinct from the first grounding location.

\* \* \* \* \*